US012750987B2

(12) United States Patent
Wenk et al.

(10) Patent No.: US 12,750,987 B2
(45) Date of Patent: Sep. 29, 2026

(54) CONTROL MODULE FOR A VEHICLE WITH AT LEAST ONE ELECTRIC MOTOR AND A TRANSMISSION

(71) Applicant: Vitesco Technologies Germany GmbH, Regensburg (DE)

(72) Inventors: Alexander Wenk, Burgoberbach (DE); Peter Schroll, Nuremberg (DE); Karl Maron, Heroldsberg (DE); Simon Kim, Nuremberg (DE); Yvonne Wiegand, Mainstockheim (DE)

(73) Assignee: Vitesco Technologies Germany GmbH, Regensburg (DE)

( * ) Notice: Subject to any disclaimer, the term of this patent is extended or adjusted under 35 U.S.C. 154(b) by 127 days.

(21) Appl. No.: 18/337,644

(22) Filed: Jun. 20, 2023

(65) Prior Publication Data

US 2023/0337403 A1 Oct. 19, 2023

Related U.S. Application Data

(63) Continuation of application No. PCT/EP2021/084842, filed on Dec. 8, 2021.

(30) Foreign Application Priority Data

Dec. 21, 2020 (DE) ..................... 10 2020 216 390.1

(51) Int. Cl.
*H05K 7/20* (2006.01)
*H05K 9/00* (2006.01)

(52) U.S. Cl.
CPC ......... *H05K 7/2089* (2013.01); *H05K 9/0037* (2013.01)

(58) Field of Classification Search
CPC .. H05K 7/2089; H05K 9/0037; H05K 5/0082; G06F 1/20
See application file for complete search history.

(56) References Cited

U.S. PATENT DOCUMENTS 6,362,964 B1 3/2002 Dubhashi
8,547,699 B1 10/2013 McCleary
(Continued)

FOREIGN PATENT DOCUMENTS

CN 1896475 A 1/2007
DE 19959023 A1 7/2001
(Continued)

OTHER PUBLICATIONS

International Search Report and Written Opinion dated Apr. 11, 2022 from corresponding International Patent Application No. PCT/EP2021/084842.
(Continued)

*Primary Examiner* — Jayprakash N Gandhi

(57) ABSTRACT

A control module for a vehicle with at least one electric motor and a transmission is provided. The control module has a housing for receiving transmission control electronics and converter electronics for controlling an electric motor. The control module also has a heat sink. The housing includes a housing upper part and a housing lower part. The heat sink is arranged between the housing upper part and the housing lower part such that the heat sink forms a part of the housing. The transmission control electronics are surrounded by a plastic sheathing. The transmission control electronics and the plastic sheathing form the housing upper part. The converter electronics are thermally conductively connected to the heat sink, and the housing upper part is thermally conductively connected to the heat sink in such a way that a heat transfer occurs from the transmission control electronics to the edge of the heat sink.

10 Claims, 4 Drawing Sheets

(56) References Cited

U.S. PATENT DOCUMENTS

| | | | | |
|---|---|---|---|---|
| 8,797,742 | B2 | 8/2014 | Kawai | |
| 9,532,460 | B2 * | 12/2016 | Meier | H05K 1/141 |
| 2001/0003503 | A1 | 6/2001 | Jocham | |
| 2004/0164703 | A1 | 8/2004 | Berels | |
| 2006/0077643 | A1 * | 4/2006 | Mayuzumi | H05K 5/0034 361/753 |
| 2009/0078489 | A1 * | 3/2009 | Feier | H02K 7/06 180/339 |
| 2009/0251831 | A1 | 10/2009 | Shiba | |
| 2010/0026090 | A1 * | 2/2010 | Nakatsu | B60L 50/16 307/9.1 |
| 2013/0088128 | A1 * | 4/2013 | Nakano | H05K 7/20854 361/709 |
| 2013/0301220 | A1 * | 11/2013 | Hotta | H02K 11/33 361/699 |
| 2014/0132379 | A1 | 5/2014 | Vafakhah | |
| 2014/0132382 | A1 | 5/2014 | Zarei | |
| 2014/0168901 | A1 * | 6/2014 | Ide | H01L 23/49575 361/717 |
| 2014/0175867 | A1 | 6/2014 | Vafakhah | |
| 2015/0009629 | A1 * | 1/2015 | Moon | H05K 5/06 29/842 |
| 2015/0062825 | A1 | 3/2015 | Schaefer | |
| 2016/0106010 | A1 * | 4/2016 | Ito | H05K 1/0209 361/707 |
| 2016/0153544 | A1 | 6/2016 | Dobbins | |
| 2016/0254719 | A1 * | 9/2016 | Pondelek | F16H 61/0006 310/54 |
| 2016/0303995 | A1 | 10/2016 | Lei | |
| 2016/0361975 | A1 | 12/2016 | Porras | |
| 2017/0072934 | A1 | 3/2017 | Onouchi | |
| 2018/0097266 | A1 | 4/2018 | Jalilevand | |
| 2018/0277460 | A1 * | 9/2018 | Suzuki | H05K 7/209 |
| 2018/0303009 | A1 * | 10/2018 | Michel | H05K 7/205 |
| 2019/0098777 | A1 * | 3/2019 | Nakatsu | H02M 1/327 |
| 2019/0320549 | A1 | 10/2019 | Song | |
| 2021/0227681 | A1 | 7/2021 | Steinau | |

FOREIGN PATENT DOCUMENTS

| | | | |
|---|---|---|---|
| DE | 102004008817 | A1 | 10/2004 |
| DE | 112007001594 | T5 | 5/2009 |
| DE | 102013222587 | A1 | 5/2014 |
| DE | 102013222595 | A1 | 5/2014 |
| DE | 102013222599 | A1 | 5/2014 |
| DE | 102014112330 | A1 | 3/2015 |
| DE | 102014012202 | A1 | 2/2016 |
| DE | 102015120674 | A1 | 6/2016 |
| DE | 112015000464 | T5 | 9/2016 |
| DE | 102016106878 | A1 | 10/2016 |
| DE | 102016109599 | A1 | 12/2016 |
| DE | 102017202440 | A1 | 9/2017 |
| DE | 102017122818 | A1 | 4/2018 |
| DE | 102018217457 | A1 | 3/2020 |
| DE | 102018217456 | A1 | 4/2020 |
| EP | 2899082 | A1 | 7/2015 |
| EP | 3284977 | A1 | 2/2018 |
| JP | 2009106073 | A | 5/2009 |
| JP | 2011189799 | A | 9/2011 |
| JP | 5292342 | B2 | 9/2013 |
| JP | 5372817 | B2 | 12/2013 |
| JP | 5417225 | B2 | 2/2014 |

OTHER PUBLICATIONS

German Search Report dated Sep. 27, 2021 for corresponding German Patent Application No. 10 2020 216 390.1.

* cited by examiner

CONTROL MODULE FOR A VEHICLE WITH AT LEAST ONE ELECTRIC MOTOR AND A TRANSMISSION

CROSS-REFERENCE TO RELATED APPLICATIONS

This application claims the benefit of PCT Application PCT/EP2021/084842, filed Dec. 8, 2021, which claims priority to German Application 10 2020 216 390.1, filed Dec. 21, 2020. The disclosures of the above applications are incorporated herein by reference.

TECHNICAL FIELD

The disclosure relates to a control module for a vehicle with at least one electric motor and a transmission. Electromobility means using electric cars. These are wholly or partially electrically driven, carry an energy storage device with them and obtain their energy predominantly from the power grid.

BACKGROUND

Hybrid vehicles combine two drive technologies. As a general rule, shorter distances can be covered electrically, but hybrid vehicles can easily manage long distances as well with their internal combustion engine. Hybrid cars which can also be charged at the socket are referred to as plug-in hybrids. Hybrid vehicles are deemed to be a bridging technology until cars are completely driven by electricity.

As a general rule, the vehicles are provided with a transmission which is designed to transfer torque between an input and an output of the transmission by way of torque-transmitting clutches.

The operation of the transmission is controlled by a transmission controller.

A further central component of the electric drive train in hybrid and electric vehicles is the power electronics. In particular, it is responsible for actuating the electric machine, communicating with the vehicle control as well as diagnosing the drive.

As a general rule, the power electronics include an electronic controller, an inverter and a DC/DC converter. The controller represents the control center of the power electronics. Direct current-alternating current converters or inverters convert the direct current of the battery into alternating current for the drive of the electric motor. Finally, the electric motor converts electrical energy into mechanical energy. The process is reversed in order to charge up the battery.

Further central elements of an electrically operated vehicle include the direct current-direct current converter, also referred to as an inverter. It converts the high battery voltage of 100-400 volts or more into the significantly lower operating voltage of 12 or 48 volts for electronic components.

DE 10 2013 222 599 A1 describes a vehicle having an internal combustion engine and an electric motor, where a transmission control module also controls the electric motor, the inverter and the DC-DC converter, in addition to the transmission.

SUMMARY

The disclosure provides a compact control module for a vehicle with at least one electric motor and a transmission, as a result of which the number of individual parts of the control module can be kept low and where it is possible to dispense with expensive, lower-loss components due to the fact that the heat created by the electronics is efficiently transported away.

The control module includes a housing that includes a housing upper part and a housing lower part, a heat sink arranged between the housing upper part and the housing lower part such that the heat sink forms a part of the housing.

The transmission control electronics are surrounded by a plastic sheathing. The transmission control electronics and the plastic sheathing form the housing upper part. As a general rule, the transmission control electronics have a printed circuit board with electronic components arranged thereon. The plastic sheathing protects the electronic components against external influences such as, for example, aggressive vapors or transmission oil.

The heat sink, for example made of aluminum, has a raised peripheral edge, where the housing upper part, via a raised peripheral edge of the plastic sheathing, is arranged on the edge of the heat sink such that the housing upper part and the heat sink form a media-tight cavity for receiving the converter electronics. The converter electronics are, in turn, thermally conductively connected to the heat sink.

The housing upper part made up of the transmission control electronics and plastic sheathing is thermally conductively connected to the heat sink in such a way that a heat transfer occurs from the transmission control electronics to the edge of the heat sink and, therefore, to the heat sink itself.

This creates a compact control module for an inverter and a transmission having a common, efficient cooling device which can be deployed both as an attached-to and as a standalone control module in a vehicle.

In some examples, the housing upper part and the heat sink are connected to one another in a thermally conducting manner and mechanically by way of at least one, for example, non-positively acting connector. The connector is, in each case, in engagement with a corresponding receptacle in the edge of the heat sink. The connector can, for example, be a pin-like connector, for example a rivet or a screw.

In some examples, each connector is guided through a thermally conductive connecting sleeve arranged in the edge of the plastic sheathing in such a way that the heat transfer occurs from the transmission control electronics to the edge of the heat sink at least via the connecting sleeves. The material of a connecting sleeve can be, by way of example, aluminum.

In some implementations, the connecting sleeve is guided through a corresponding bore in the housing upper part made up of the transmission control electronics and the plastic sheathing, configuring a thermally conducting contact with the transmission control electronics. In the event that the bore is only arranged in the plastic sheathing, the heat transfer occurs from the transmission control electronics indirectly via the plastic sheathing and the connecting sleeve arranged therein to the edge of the heat sink. A better heat transfer is then provided if the bore projects both through the transmission control electronics and through the plastic sheathing.

In some examples, the transmission control electronics includes a printed circuit board with electronic components. The electronic components are either arranged on the side of the printed circuit board facing away from the converter electronics, or on the side of the printed circuit board facing the converter electronics, or on both sides of the printed circuit board. In all of the indicated cases, merely the side of the transmission control electronics facing away from the converter electronics, virtually forming a housing lid, is mainly enveloped with the plastic sheathing. At least the lateral edge of the transmission control electronics can also be enveloped, for example, by the edge of the plastic sheathing, which leads to better adhesion of the plastic sheathing to the transmission control electronics. However, the side of the printed circuit board facing the converter electronics could also be at least partially additionally enveloped with a plastic sheathing.

In some implementations, a flat shield is arranged in the raised edge of the plastic sheathing of the housing upper part, for example between the transmission control electronics and the converter electronics. The shield serves, above all, to reduce or to avoid mutually harmful electromagnetic interaction between the converter electronics and the transmission control electronics. Additionally, in order to reduce the EMI between the converter electronics and the transmission control electronics, the shield also serves to reduce or avoid the thermal interaction, such as mutual heating, between the converter electronics and the transmission control electronics. The heat radiated from the electronics is conducted via the shield to the housing upper part, made up of the transmission control electronics and the plastic sheathing, and from the housing upper part to the edge of the heat sink. For example, a flat shield, for example a steel plate or another metallic plate, can be arranged at least at two opposite edge lengths of the shield, contacting the housing upper part. The mechanical connection of the shield to the housing upper part can be executed substantially non-positively or positively.

The shield could also include a composite structure made of plastic and a special EMI protective film. Alternatively, the shield could also be arranged on the heat sink.

In some implementations, the plastic sheathing is made of thermosetting plastic or thermoplastic, where the plastic sheathing can be provided with at least one inorganic filler such as, for example, aluminum oxide to increase the thermal conductivity.

In some examples, the thermally conductive connection between the converter electronics and the heat sink is brought about by a thermal material.

Depending on the quantity of heat to be dissipated and, in particular, depending on the size of the contact surface of the parts involved in the heat transfer, standard, silicone-based thermal pastes or high-performance thermal pastes or thermal adhesives having improved thermal conductivity can be utilized, by way of example.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
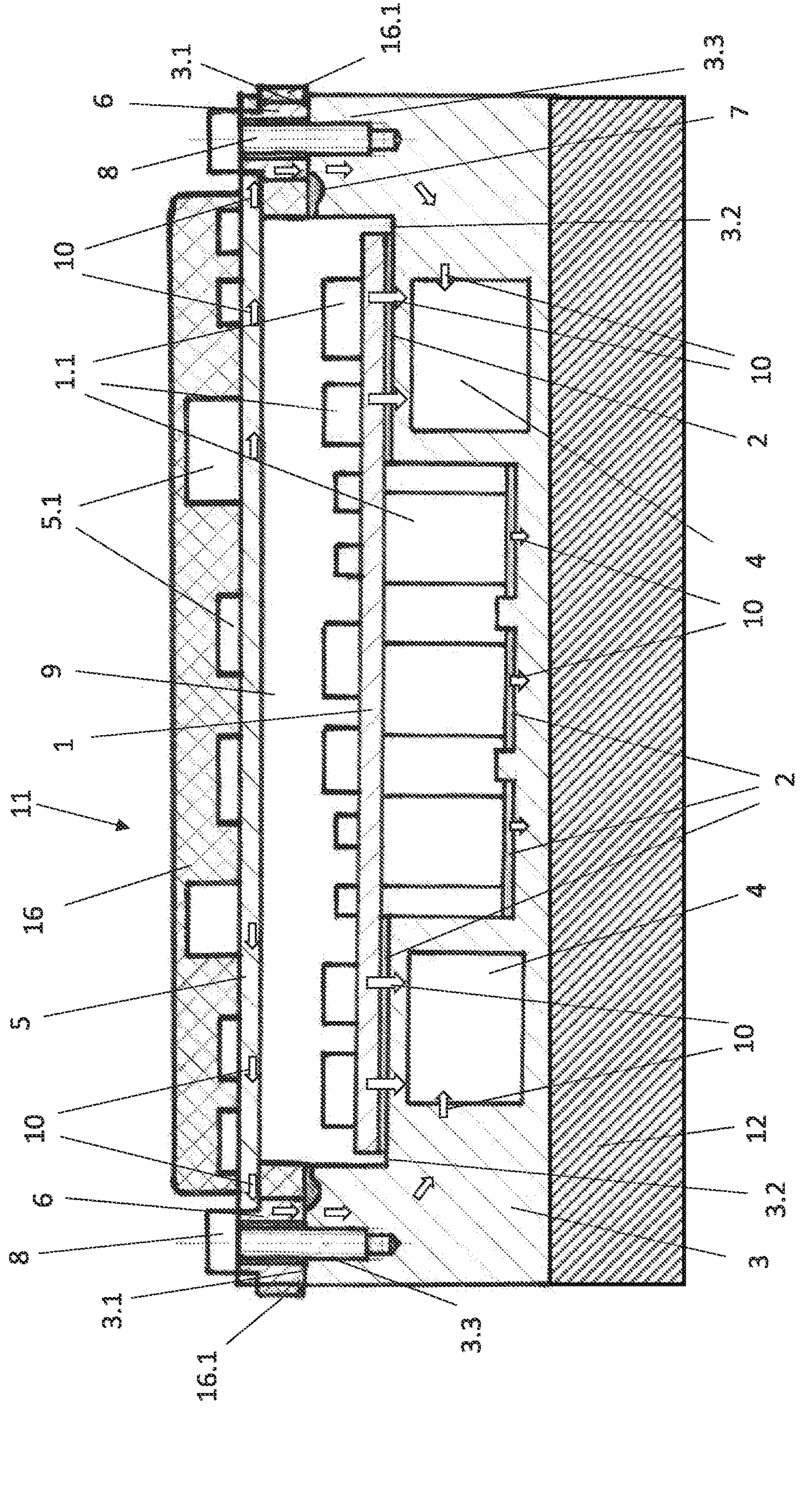
FIG. 1 shows a schematic sectional view of an exemplary control module.

FIG. 1 shows a control module for a vehicle having at least one electric motor and a transmission, for example an electric car or a hybrid vehicle. The control module has a housing 11, 12 for receiving transmission control electronics 5 for controlling the transmission and converter electronics 1 for controlling the at least one electric motor. Additionally, the control module has a heat sink 3 in order to transport the heat generated by the electronics 1, 5 away via a coolant.

The housing 11, 12 substantially includes a housing upper part 11 and a housing lower part 12, where the transmission control electronics 5 are surrounded by a plastic sheathing 16 with a raised peripheral edge 16.1, and the transmission control electronics 5 and the plastic sheathing 16 form the housing upper part 11.

The heat sink 3 is arranged between the housing upper part 11 and the housing lower part 12 such that the heat sink 3 forms a part of the housing 3, 11, 12.

The heat sink 3 has a raised peripheral edge 3.1, where the housing upper part 11, via the raised peripheral edge 16.1 of the plastic sheathing 16, is arranged on the edge 3.1 of the heat sink 3 such that the housing upper part 11 and the heat sink 3 form a media-tight cavity 9 for receiving the converter electronics 1 and, as a result of which, the converter electronics 1 are thermally conductively connected, for example by a thermal material 2, to the heat sink 3.

The converter electronics 1 include a printed circuit board and electronic components 1.1 arranged thereon. Here, the electronic components 1.1 are mounted both on the upper side of the printed circuit board of the converter electronics 1 facing the housing upper part 11 and on the lower side thereof, where the electronic components 1.1 are arranged, here, on the lower side in the central region of the printed circuit board, in the vicinity of a coolant channel 4 of the heat sink. As a result of the printed circuit board of the converter electronics 1 being fitted on both sides, the heat sink 3 has a step 3.2 peripherally in the direction of its edge 3.1, on which the component-free part of the lower side of the converter electronics 1 rests. A thermal material 2 between the step 3.2 of the heat sink 3 and the converter electronics 1 guarantees a good heat transfer 10 from the converter electronics 1 to the heat sink 3. When a thermal adhesive 2 is used, an extra mechanical connection between the converter electronics 1 and the heat sink 3 can be dispensed with.

In FIG. 1, the height of the step 3.2 is adapted to the height of the electronic components 1.1 arranged on the lower side of the converter electronics 1 such that the components 1.1, here, are directly connected thermally conductively to the heat sink 3 by the thermal material 2.

In the case of the electronic components 1.1 arranged on the lower side of the converter electronics 1, the heat transfer 10 to the heat sink 3 consequently occurs both indirectly via the printed circuit board of the converter electronics 1 and directly from the components 1.1. Here, for example, electronic components 1.1, which generate a particularly large amount of heat, can therefore be fitted to the printed circuit board. Additionally, in order to further increase the heat transfer 10 to the heat sink 3, instead of a standard thermal material 2, a better high-performance thermal material which is, admittedly, more expensive can be utilized.

The housing upper part 11 and the heat sink 3 are connected to one another in a thermally conducting manner and mechanically by at least one connection means or connector 8, such as non-positively, where the connector 8 is in each case in engagement with a corresponding receptacle 3.3 in the edge 3.1 of the heat sink 3. In FIG. 1, a screw 8 is rotated into a corresponding thread 3.3 in the heat sink 3. Instead of a screw, a rivet could, for example, also be used.

A peripheral seal 7 is arranged here between the housing upper part 11 and the heat sink 3 in order to increase the sealing effect. The seal 7 can be executed, for example, as an insert seal or an adhesive seal.

Here, the connector 8 is guided through a thermally conductive connecting sleeve 6 arranged in the edge 16.1 of the plastic sheathing 16 in such a way that the heat transfer 10 substantially occurs from the transmission control electronics 5 to the edge 3.1 of the heat sink 3 via the connecting sleeve 6. As a general rule, the connecting sleeve 6 is inserted in a corresponding mold during the enveloping process, such as an injection molding method, of the transmission control electronics 5 with plastic, for example a thermosetting plastic or a thermoplastic, and is injection molded as well. The heat transfer 10 can thus occur from the transmission control electronics 5 indirectly via the plastic sheathing 16 and the connecting sleeve 6 arranged therein to the edge 3.1 of the heat sink 3.

The transmission control electronics 5 have a printed circuit board with electronic components 5.1 arranged thereon. In order to achieve an improved heat transfer 10 from the printed circuit board of the transmission control electronics 5 to the heat sink 3, the connecting sleeve 6, here, is guided through a corresponding bore in the printed circuit board of the transmission control electronics 5, where the connecting sleeve 6 is in thermally conducting contact with the bore in the printed circuit board.

The electronic components 5.1 are arranged, here in FIG. 1, on the side of the printed circuit board of the transmission control electronics 5 facing away from the converter electronics 1.

The housing lower part 12 can be fastened non-positively to the side of the heat sink 3 opposite the housing upper part 11, for example, not shown here, by means of a screw, or firmly bonded by way of welding or adhesion and forms the interface of the control module with a transmission (not shown).

Figure 2:
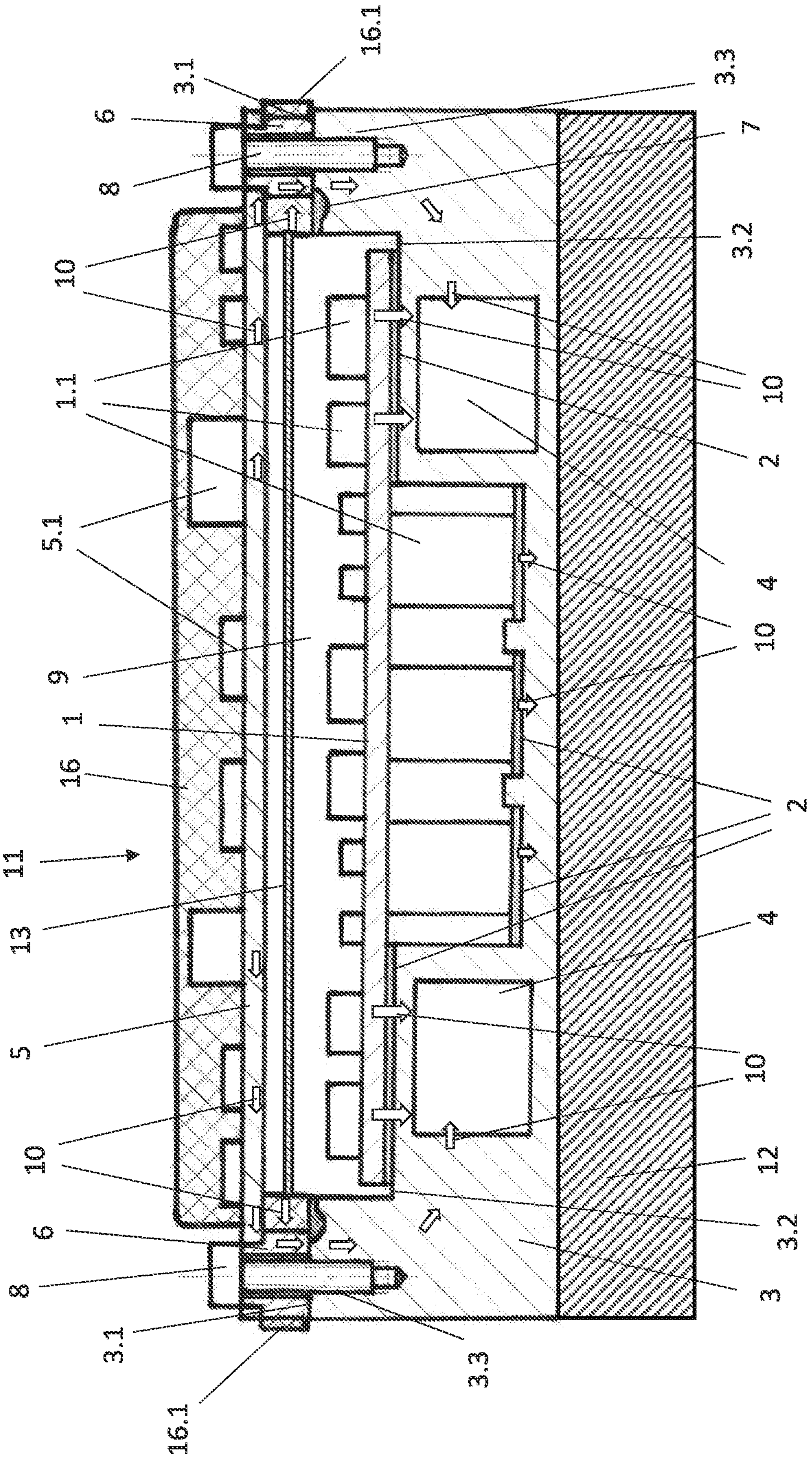
FIG. 2 shows a further sectional view of an exemplary control module.

FIG. 2 shows a schematic sectional view of a control unit, as in FIG. 1, but a shield 13 is arranged in the raised edge 16.1 of the plastic sheathing 16 of the housing upper part 11 between the transmission control electronics 5 and the converter electronics 1. Alternatively, the shield 13 could also be arranged on the heat sink 3. The shield 13 serves, on the one hand, to reduce or to avoid a mutual harmful electromagnetic interaction (EMI=electromagnetic interference) between the converter electronics 1 and the transmission control electronics 5. Additionally, in order to reduce the EMI between the converter electronics 1 and the transmission control electronics 5, the shield 13 also serves to reduce or avoid the thermal interaction, such as mutual heating, between the converter electronics 1 and the transmission control electronics 5.

The heat is conducted from the converter electronics 1 or from the transmission control electronics 5 via the shield 13 to the edge 16.1 of the plastic sheathing 16 and from the edge 16.1 to the edge 3.1 of the heat sink 3. The flat shield 13 can be implemented as a steel plate or another metallic plate. However, the shield 13 could also include a composite structure made of plastic and a special EMI protective film.

Of course, this description regarding the arrangement and the function of the shield 13 also applies to the alternative that the shield 13 is arranged on the heat sink 3 instead of on the housing upper part 11.

Figure 3:
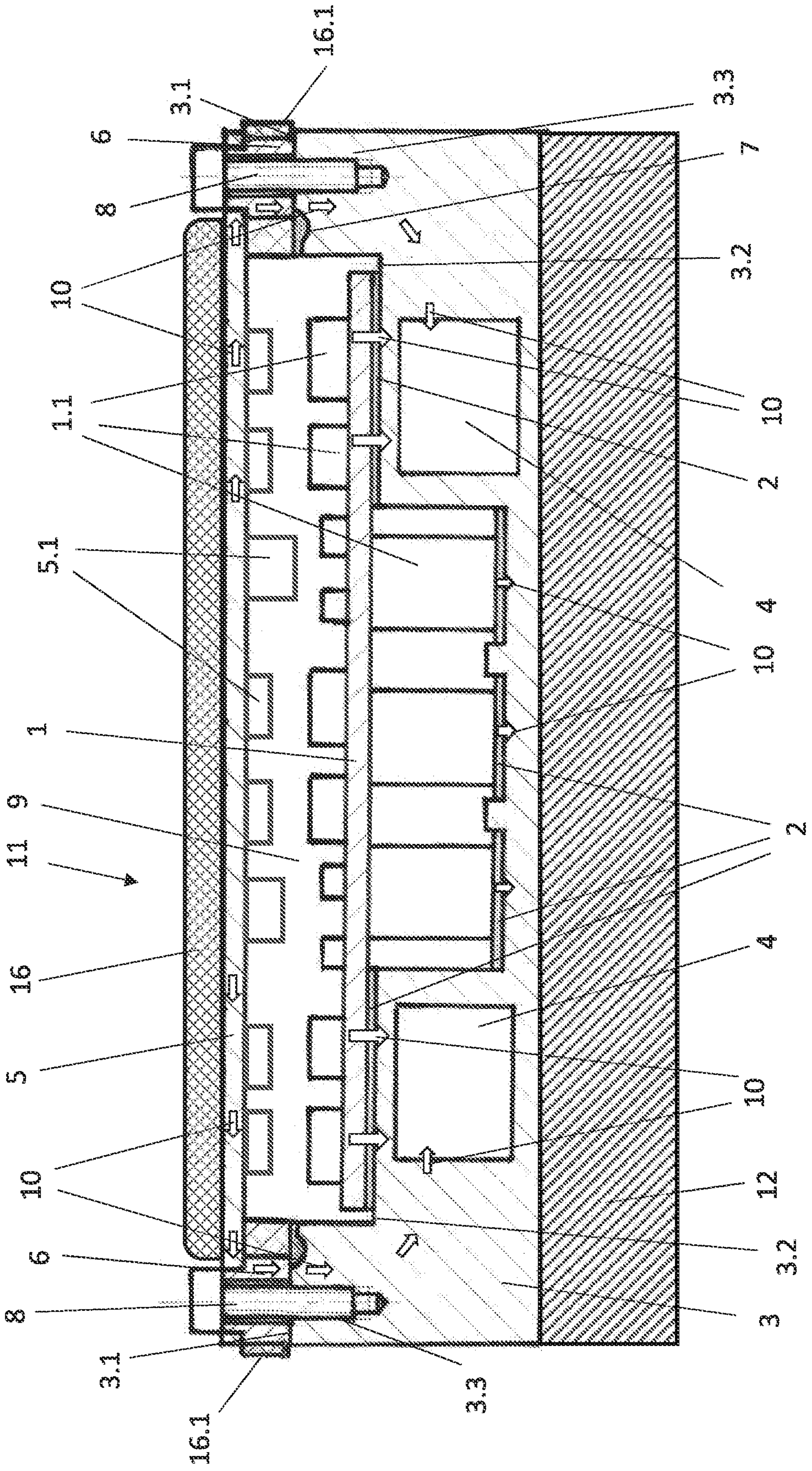
FIG. 3 shows an alternative sectional view of an exemplary control module.

FIG. 3 shows a schematic sectional view of a control unit like that in FIG. 1. However, here, the electronic components 5.1 are arranged on the side of the transmission control electronics 5 facing the converter electronics 1. This makes it possible to achieve an extremely flat design of the control module.

It would also be possible for the side of the transmission control electronics 5 facing the converter electronics 1 to be at least partially enveloped with a plastic sheathing 16, which is not depicted in FIG. 3.

It would also be conceivable for the electronic components 5.1 to be arranged on both sides of the transmission control electronics 5. This then makes it possible to achieve a very compact design of the control module.

Figure 4:
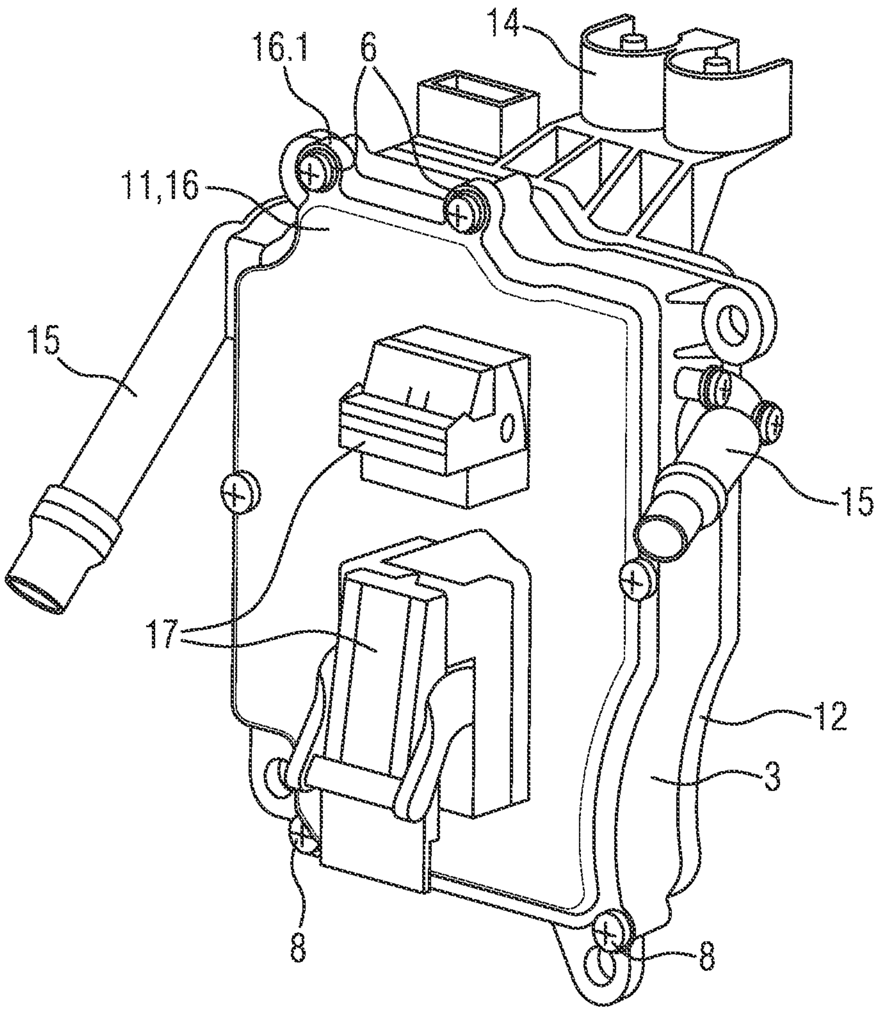
FIG. 4 shows an exemplary control module housing in a 3D representation.

FIG. 4 shows an outer view of a control module housing having a housing upper part 11 with plastic sheathing 16, a heat sink 3, and a housing lower part 12, the heat sink 3 being arranged between the housing upper part 11 and the housing lower part 12.

The housing upper part 11 and the heat sink 3 are connected to one another by way of the connector 8, where the connector 8 is in each case guided through a connecting sleeve 6 in the raised peripheral edge 16.1 of the plastic sheathing 16.

The heat transfer thus occurs from the transmission control electronics via the plastic sheathing 16 and the connecting sleeve 6 arranged therein to the edge 3.1 of the heat sink 3.

Here, the electrical connections 17 of the transmission control electronics 5, such as for exchanging signals and supply voltages with the surrounding electronics (not shown), are located on the upper side of the housing upper part 11, but could also be positioned on the side of the housing upper part 11.

Here, the electrical connection 14 for the converter electronics 1 is arranged on the housing lower part 12.

Here, the heat sink 3 has a cooling connection 15 on each of its longitudinal sides.

A number of implementations have been described. Nevertheless, it will be understood that various modifications may be made without departing from the spirit and scope of the disclosure. Accordingly, other implementations are within the scope of the following claims.

What is claimed is:

1. A control module for a vehicle with at least one electric motor and a transmission, the control module comprising:

transmission control electronics;

converter electronics;

a housing for receiving the transmission control electronics and the converter electronics for controlling the at least one electric motor, wherein the housing comprises:

a housing upper part, and a housing lower part, wherein the transmission control electronics are surrounded by a plastic sheathing, and the transmission control electronics and the plastic sheathing form the housing upper part; and a heat sink arranged between the housing upper part and the housing lower part such that the heat sink forms a part of the housing, the heat sink includes a raised peripheral edge, the converter electronics are thermally conductively connected to the heat sink; and a media-tight cavity receiving the converter electronics, the housing upper part, via a raised peripheral edge of the plastic sheathing, is arranged on the raised peripheral edge of the heat sink such that the housing upper part and the heat sink form the media-tight cavity, wherein the housing upper part is thermally conductively connected to the heat sink in such a way that heat is transferred from the transmission control electronics to the raised peripheral edge of the heat sink.

2. The control module of claim 1, wherein the housing upper part and the heat sink are connected to one another in a thermally conducting manner and mechanically by at least one connector, wherein each of the at least one connector is in engagement with a corresponding receptacle in the raised peripheral edge of the heat sink.

3. The control module of claim 2, wherein the at least one connector is a screw or a rivet.

4. The control module of claim 2, wherein each of the at least one connector is guided through a thermally conductive connecting sleeve arranged in the raised peripheral edge of the plastic sheathing in such a way that the heat transfer occurs from the transmission control electronics to the raised peripheral edge of the heat sink at least via the thermally conductive connecting sleeve.

5. The control module of claim 4, wherein the thermally conductive connecting sleeve is guided through a corresponding bore in the housing upper part made up of the transmission control electronics and the plastic sheathing, configuring a thermally conducting contact.

6. The control module of claim 1, wherein the transmission control electronics includes a printed circuit board with electronic components, the electronic components are either arranged on a side of the printed circuit board of the transmission control electronics facing away from the converter electronics, or on a side of the printed circuit board facing the converter electronics, or on both sides of the printed circuit board.

7. The control module of any one of claim 1, wherein a flat shield is arranged in the raised peripheral edge of the plastic sheathing of the housing upper part, between the transmission control electronics and the converter electronics.

8. The control module of claim 1, wherein the plastic sheathing is made of thermosetting plastic or thermoplastic.

9. The control module of claim 1, wherein the plastic sheathing is provided with at least one inorganic filler in order to increase the thermal conductivity.

10. The control module of claim 1, wherein a thermally conductive connection between the converter electronics and the heat sink is realized by way of a thermal material.

* * * * *